United States Patent [19]
Kim et al.

[11] Patent Number: 5,315,557
[45] Date of Patent: May 24, 1994

[54] SEMICONDUCTOR MEMORY DEVICE HAVING SELF-REFRESH AND BACK-BIAS CIRCUITRY

[75] Inventors: Moon-Gone Kim, Kyungi; Sei-Seung Yoon, Seoul, both of Rep. of Korea

[73] Assignee: Samsung Electronics Co., Ltd., Kyunggi, Rep. of Korea

[21] Appl. No.: 980,951

[22] Filed: Nov. 25, 1992

[30] Foreign Application Priority Data

Nov. 25, 1991 [KR] Rep. of Korea ............ 21143

[51] Int. Cl.⁵ ............ G11C 11/402; G11C 7/02
[52] U.S. Cl. ............ 365/222; 365/189.09; 365/227; 365/228; 365/236; 365/225.7; 307/296.2; 307/296.5
[58] Field of Search ............ 365/222, 189.09, 226, 365/227, 228, 236, 225.7; 307/296.4, 296.5, 530, 296.2

[56] References Cited

U.S. PATENT DOCUMENTS

| | | | |
|---|---|---|---|
| 4,471,290 | 9/1984 | Yamaguchi | 307/304 |
| 4,660,180 | 4/1987 | Tanimura et al. | 365/222 |
| 4,809,233 | 2/1989 | Takemae | 365/222 |
| 4,829,484 | 5/1989 | Arimoto et al. | 365/222 |
| 4,939,695 | 7/1990 | Isobe et al. | 365/222 |
| 4,961,167 | 10/1990 | Kumanoya et al. | 365/189.09 |
| 4,964,082 | 10/1990 | Sato et al. | 365/189.09 |
| 4,985,869 | 1/1991 | Miyamoto | 365/226 |

OTHER PUBLICATIONS

Konishi et al., "A 38-ns 4-Mb DRAM with a Battery-Backup (BBU) Mode", IEEE Journal of Solid-State Circuits, vol. 25, No. 5, Oct., 1990, pp. 1112-1117.

*Primary Examiner*—Eugene R. LaRoche
*Assistant Examiner*—Andrew Tran
*Attorney, Agent, or Firm*—Cushman Darby & Cushman

[57] ABSTRACT

A semiconductor memory device includes a refresh timer for generating a refresh clock pulse, a binary counter for generating a predetermined number of signals of different frequencies and a circuit for generating a self-refresh enable signal in response to the signal transmitted from the binary counter. A back-bias clock pulse generator is also included having first, second and third selectors, of which the third selector selects one of the signals transmitted from the binary counter in response to a signal output from each of the first and second selectors. A back-bias generator having an oscillator and a back-bias voltage detecting circuit and a selection circuit for receiving the output signal from the back-bias voltage detection circuit is attached thereto. A signal is transmitted to the oscillator in response to the self-refresh enable signal. The oscillator output, together with the output of the back-bias control pulse generator, cause a driver control circuit to feed a drive signal to a charge pump during a self-refresh operation.

7 Claims, 7 Drawing Sheets

SEMICONDUCTOR MEMORY DEVICE HAVING SELF-REFRESH AND BACK-BIAS CIRCUITRY

BACKGROUND OF THE INVENTION

1. Field of the Invention

This invention relates to a semiconductor memory device, and more particularly to a semiconductor memory device having self-refresh and back-bias circuitry.

2. Description of the Related Art

A self-refresh operation is performed to protect data stored in memory cells of a semiconductor memory device such as a DRAM (dynamic RAM). The self-refresh operation regenerates stored information in all memory cells during a given period using a refresh timer.

During the self-refresh operation, a normal read-write operation is interupted. The power consumed during the self-refresh operation is mainly due to a self-refresh current, a back-bias current and a current consumed by a back-bias generator.

The back-bias generator detects a substrate voltage level (also known as back-bias voltage). An oscillator and charge pump circuit provided therein are controlled in response to the detected substrate voltage. The operation and structure of a conventional back-bias generator are disclosed in U.S. Pat. No. 4,471,290.

The self-refresh operation regenerates information in memory cells during a given period under the control of a refresh timer and an address counter coupled thereto. During this period, write circuits associated with peripheral circuits of a memory array are disabled. The address counter is coupled to an address buffer so as to continue a write operation when the refresh operation is completed. Conventional self-refresh circuitry is disclosed in U.S. Pat. Nos. 4,809,233, 4,829,484 and 4,939,695.

The self-refresh operation and the back-bias operation are provided for preserving data in memory cells. The back-bias operation maintains an electric potential of a substrate at a predetermined level. The self-refresh operation occurs during a self-refresh period to protect the data stored in memory cells. The back-bias generator must be inactive during the self-refresh operation. If not deactivated, the back-bias generator consumes power unnecessarily during this period. A semiconductor memory device having both these functions is disclosed in an article published by ISSCC of IEEE, pp 230–231, entitled "A 38ns 4 Mb DRAM with a Battery Back-up (BBU) Mode" (February 1990).

FIG. 1A shows a configuration of a semiconductor memory device disclosed in the above article. The 4Mbit DRAM includes a batery-backup (BBU) mode. The BBU mode is a kind of self-refresh mode, however, its power dissipation is reduced compared to that of a normal refresh operation. More specifically, BBU is an operation mode during which the data retention operation is performed in a VLSI semiconductor memory device having low power consumption as used in a portable computer, such as lap-top or note-book personal computers which are powered by a battery.

FIG. 1B shows a timing diagram for the BBU mode for the circuit in FIG. 1A. The DRAM enters the BBU mode when the CAS is held low for more than 16 ms after a CBR (CAS before RAS) sequence, without a refresh cycle. The BBU mode continues as long as the CAS is low, and the DRAM is reset to the normal mode on rising RAS.

The refresh timer, consisting of a ring oscillator and binary counters, generates a refresh request signal with a 64 $\mu$s period. As a result, all memory cells are refreshed within 4096 cycles per 256 ms during a BBU mode. This refresh period is 16 times longer than than of prior self-refresh circuits used in similar 4Mbit DRAMs.

FIG. 2 shows a circuit diagram of the back-bias (Vbb) generator and BBU control circuit interconnection of FIG. 1A. The duty cycle of this circuit is one eighth that in the normal operation since the substrate current during BBU mode is lower than in normal mode. This back-bias generator works during reset and sensing operations as determined by the refresh request signal output from the BBU control circuit.

When the refresh timer supplies a signal having a period of 16 ms to the BBU control circuit, the BBU control circuit generates a BBU enable signal. After the BBU enable signal is generated, the refresh timer generates a clock pulse of 64 $\mu$s period, and the BBU control circuit generates a refresh request signal in response to the 64 $\mu$s clock pulse. Based on the refresh request signal, the refresh operation is performed by operating one array driver each 64 $\mu$s period.

With reference to FIG. 2, the refresh request signal from the BBU control circuit controls the operation of an oscillator used in connection with the back-bias generator. While the refresh request signal is at logic "low" state, i.e., while the refresh operation is performed, the logic "low" state refresh request signal disables a NAND gate of the oscillator so as to inactivate the back-bias generator.

As described, the back-bias generator is active while the refresh request signal is enabled and is inactive while the self-refresh operation is performed. As shown in prior art FIGS. 1A, 1B and 2, the refresh request signal is generated by the refresh timer so as to provide a constant period (or constant frequency).

The refresh period, which is selected to be 64 $\mu$s in the above embodiment, is chosen using a predetermined number of binary counters as shown in FIG. 1. When it becomes necessary for a user to vary the refresh period to optimize power consumption in a particular system, changing the number of binary counters may be a great inconvenience.

SUMMARY OF THE INVENTION

An object of this invention is to provide an improved semiconductor memory device which makes use of optimum electric power during a self-refresh operation.

An another object of this invention is to provide a semiconductor memory device requiring self-refresh and back-bias operations, and further requiring selection of a proper frequency signal to be applied to an oscillator which relates to signal generation of a back-bias voltage during the self-refresh operation.

According to an aspect of the present invention, a semiconductor memory device is disclosed including a refresh timer for generating a refresh clock pulse, a binary counter for generating a predetermined number of signals of different frequencies in response to the refresh clock pulse, a circuit for generating a self-refresh enable signal in response to the signal transmitted from the binary counter, a back-bias clock pulse generator having first, second and third selectors, of which the third selector selects one of the signals transmitted from the binary counter in response to outputs from each of the first and second selectors, a back-bias generator having an oscillator, a back-bias voltage detection circuit, and a selection circuit for receiving an output signal from the back-bias voltage detecting circuit and transmitting a different signal to the oscillator in response to the self-refresh enable signal, and a driver control circuit for receiving the output signal from the oscillator and gating that signal to the back-bias control clock pulse.

DETAILED DESCRIPTION OF THE PREFERRED EMBODIMENTS

Figure 3:
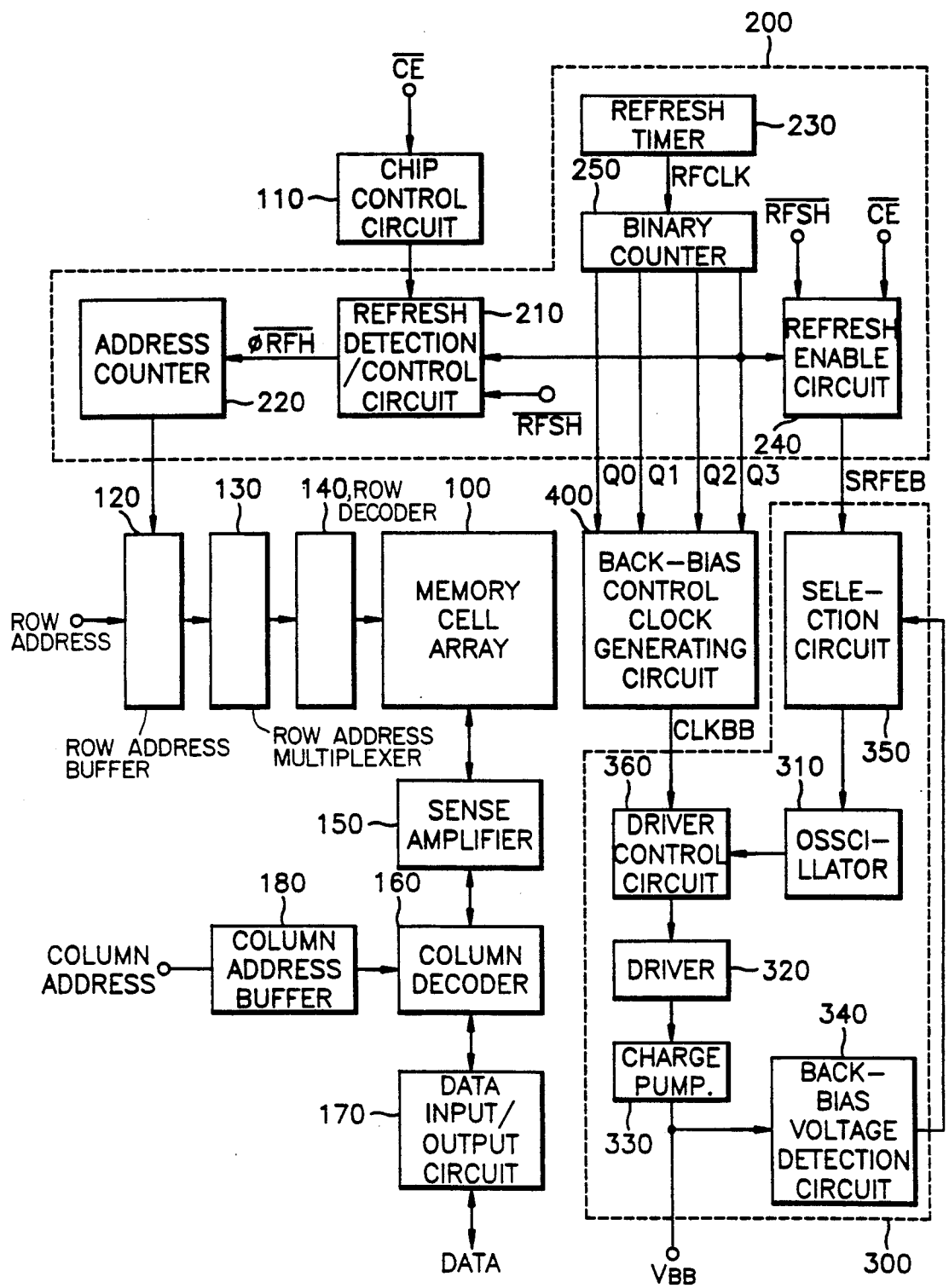
FIG. 3 is a block diagram of a semiconductor memory device according to the present invention.

FIG. 3 illustrates a configuration of a semiconductor memory device according to the present invention. The present invention finds use in a memory device such as a DRAM or a pseudo static RAM, provided with self-refresh control.

With reference to FIG. 3, memory cell array 100, row and column decoders 140, 160, row and column address buffers 120, 180, address multiplexer 130, sense amplifier 150, data input/output circuit 170 and a chip control circuit 110, are provided. These are the most fundamental elements for constructing a semiconductor memory device.

Self-refresh device 200 includes refresh timer 230, binary counter 250, refresh enable circuit 240, refresh detection/control circuit 210 and address counter 220. Back-bias generator 300 includes selection circuit 350, oscillator 310, driver control circuit 360, driver 320, charge pump 330 and back-bias voltage detection circuit 340.

Back-bias control clock generating circuit 400 receives signals Q0, Q1, Q2, Q3, of different frequencies, transmitted from binary counter 250, and transmits back-bias control clock pulse CLKBB to driver control circuit 360 of back-bias generator 300.

Refresh detection/control circuit 210 transmits refresh control signal $\overline{\Phi RFH}$ to address counter 220 in response to chip enable signal $\overline{CE}$ which is received by chip control circuit 110.

Address counter 220 generates an internal address in response to signal $\overline{\Phi RFH}$ and transmits that address to address buffer 120 so as to execute an addressing operation for the self-refresh operation.

Refresh timer 230 supplies refresh clock pulse RFCLK of a predetermined period to binary counter 250, and binary counter 250 supplies signals Q0, Q1, Q2, Q3 to refresh detection/control circuit 210 and refresh enable circuit 240.

Figure 1A:
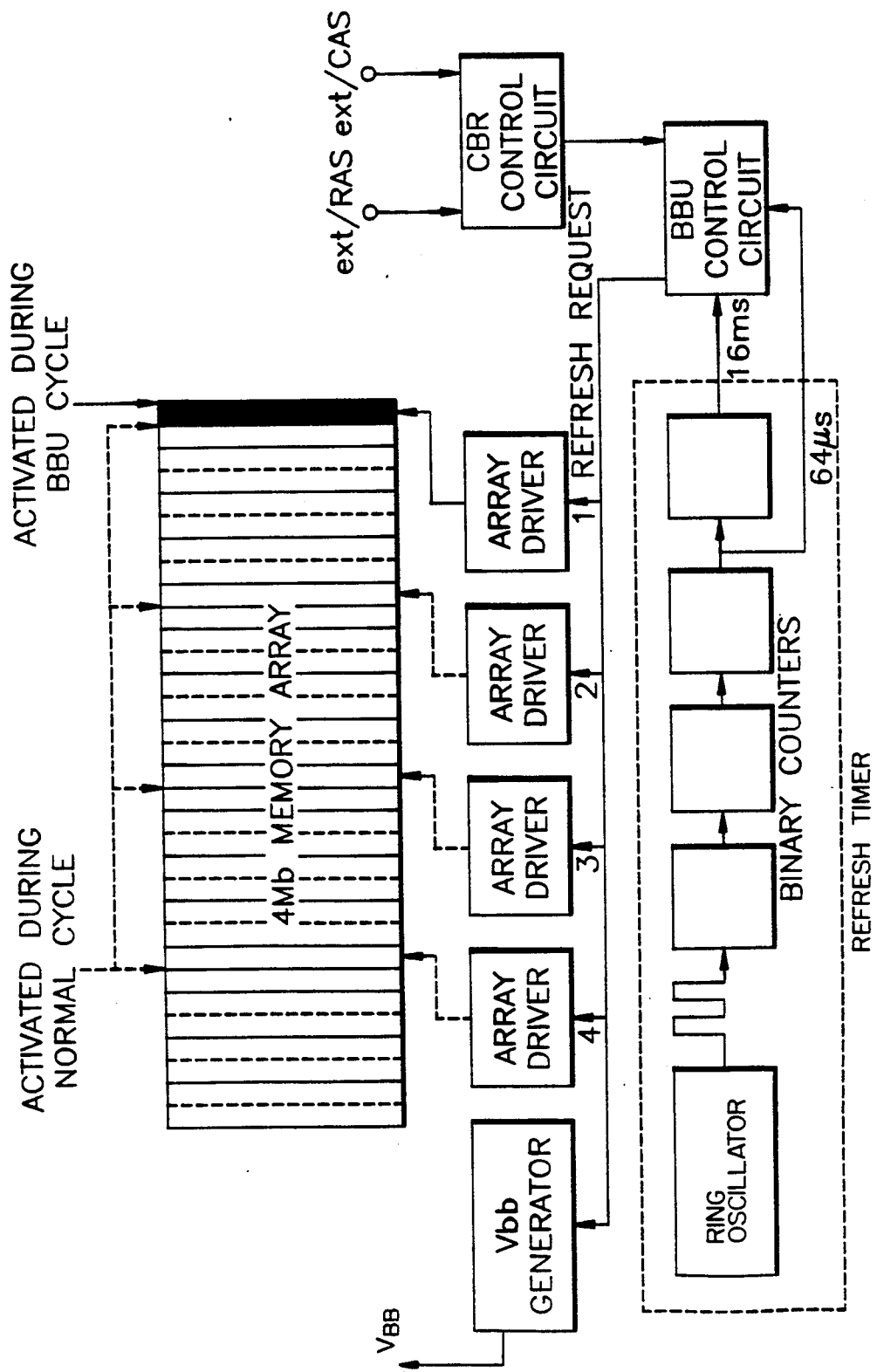
FIG. 1A is a block diagram of a semiconductor memory device having conventional self-refresh circuitry.
Figure 1B:
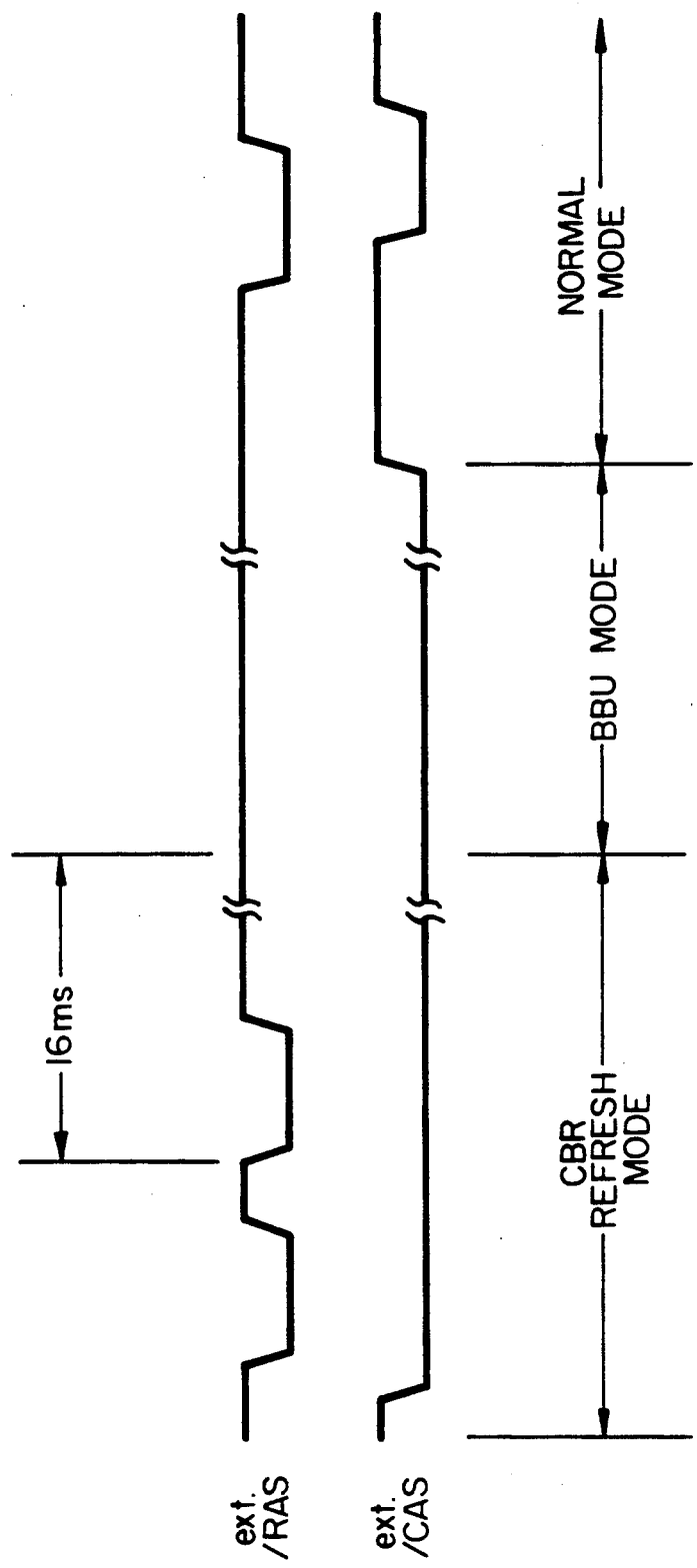
FIG. 1B shows a timing diagram of the BBU mode in the circuit in FIG. 1A;.
Figure 2:
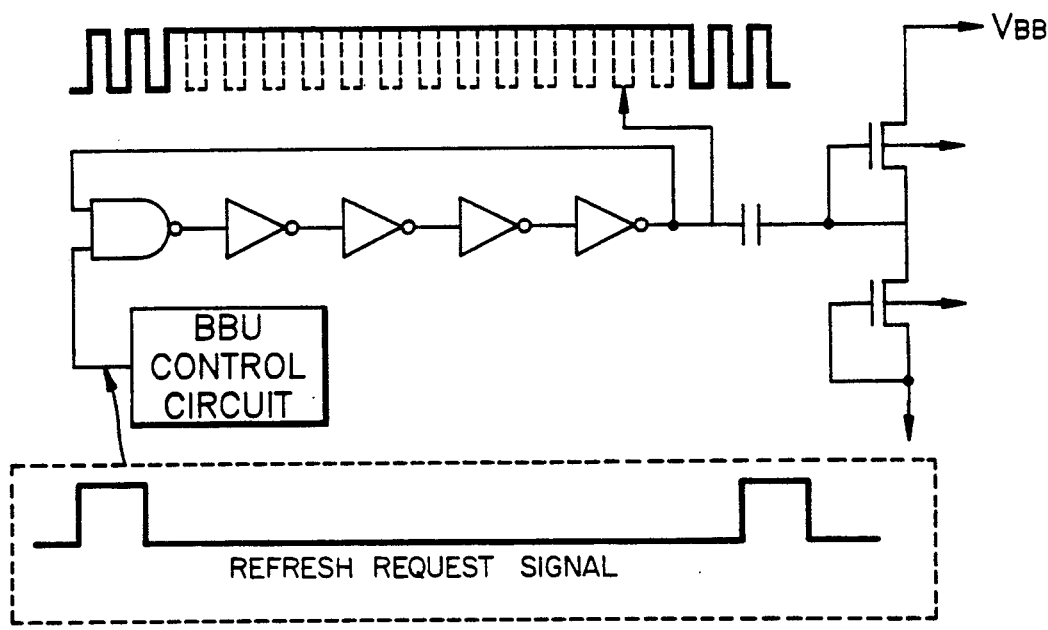
FIG. 2 is a circuit diagram of the back-bias generator shown in FIG. 1A.

It should be appreciated that binary counter 250 is constructed in the same way as the binary counter circuit shown in FIG. 1. Thus, a group of signals Q0 through Q3 may be provided by sequentially dividing by 2 a frequency of a given preceding one of the signals, i.e. Q0 to Q2. For example, the signal Q3 is provided by dividing a frequency of preceding signal Q2 by 2. Meanwhile, signal Q2 is produced by dividing a frequency of signal Q1 by 2 and signal Q1 is produced by dividing a frequency o preceding signal Q0 by 2.

Refresh enable circuit 240 receives signal Q3 from binary counter 250 and transmits self-refresh enable signal SRFEB to selection circuit 350 in response to signal Q3, signal $\overline{RFSH}$, and signal $\overline{CE}$. The operation of refresh enable circuit 240 and back-bias control clock generating circuit 400 will be described later. Back-bias generator 300 is shown having oscillator 310, driver 320 and charge pump 330.

Driver control circuit 360 is provided as a distinct circuit in the present invention for achieving the object of the present invention. The interconnection of oscillator 310 to back-bias voltage detection circuit 340 is also quite different from that in a conventional back-bias generator. For example, in the present invention, a feedback path is not provided between back-bias voltage detection circuit 340 and oscillator 310. Instead, a feedback path is formed between back-bias voltage detection circuit 340 and selection circuit 350.

Figure 4:
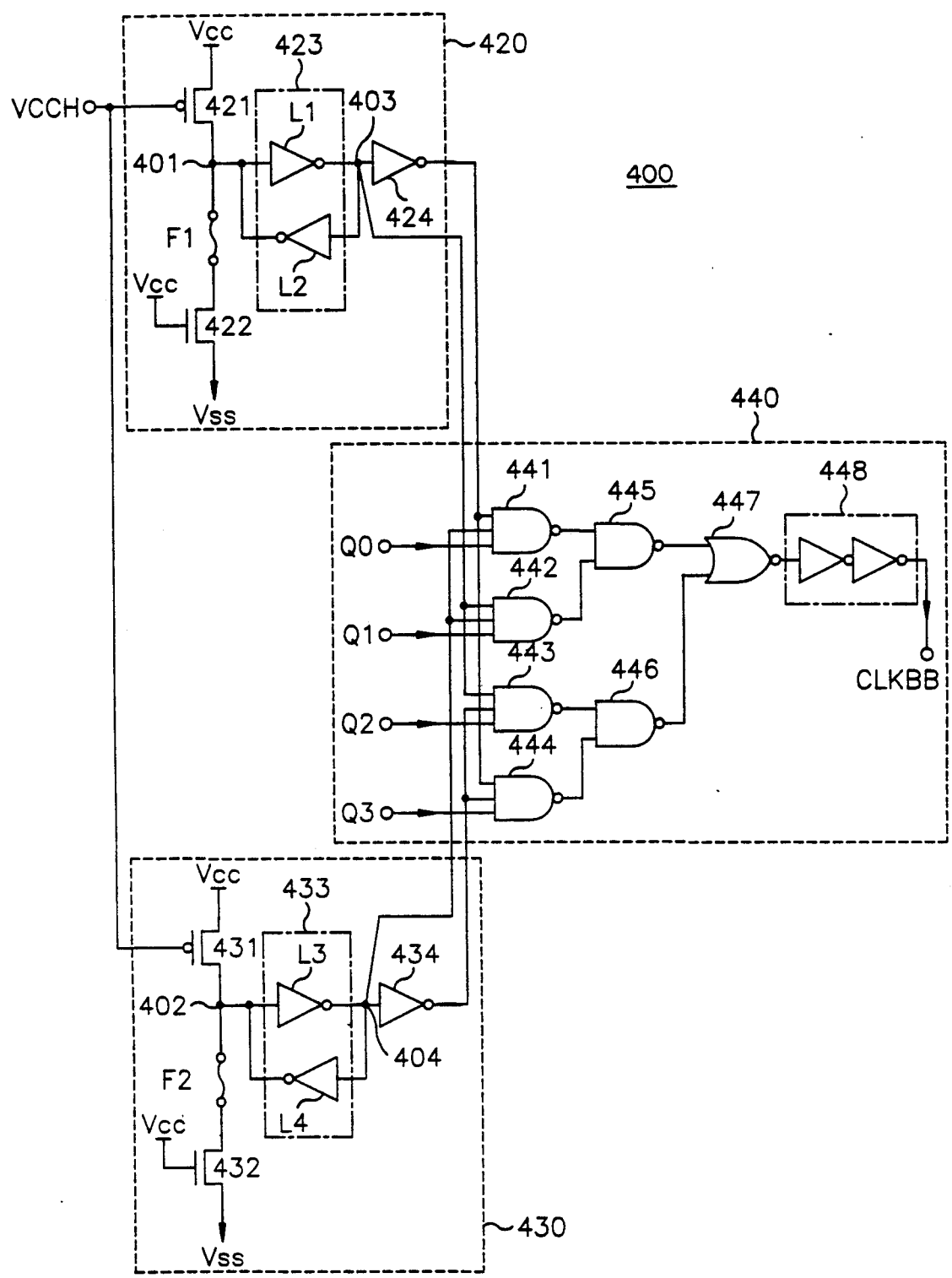
FIG. 4 is a preferred embodiment of a VBB control clock generator shown in FIG. 3.

FIG. 4 is an embodiment of back-bias control clock generating circuit 400 shown in FIG. 3. When source voltage Vcc rises above a predetermined level, voltage signal $V_{CCH}$ is at logic "high." Back-bias control clock generating circuit 400 has first and second selectors 420, 430 for determining a logic level with the use of programmable fuse links. Third selector 440 is also provided for selecting one of signals Q0, Q1, Q2, Q3 transmitted from binary counter 250 under the control of selection signals output from first and second selectors 420, 430.

First selector 420 includes PMOS transistor 421 of which gate terminal receives the voltage signal $V_{CCH}$ and of which source terminal receives the source voltage Vcc. First node 401 is connected between the drain terminal of PMOS transistor 421 and ground voltage Vss. First selector 420 also includes second node 403, a first fuse F1 connected serially between first node 401 and ground voltage Vss, first latch L1 connected between first node 401 and second node 403, and inverter 424 for inverting the voltage at second node 403.

Second selector 430 includes PMOS transistor 431, third node 402, a second fuse F2, NMOS transistor 432, second latch 433, fourth node 404 and inverter 434, all connected as in first selector 420.

Third selector 440 selectively inputs the selection signals output from first and second selectors 420, 430 and signals Q0, Q1, Q2, Q3 transmitted from binary counter 250, to four NAND gates 441–444.

NAND gate 445 receives the outputs from NAND gates 441 and 442, and NAND gate 446 receives the outputs from NAND gates 443 and 444. NAND gate 447 receives the outputs of NAND gates 445, 446 and generates pulse CLKBB at the output of buffer 448.

Figure 5:
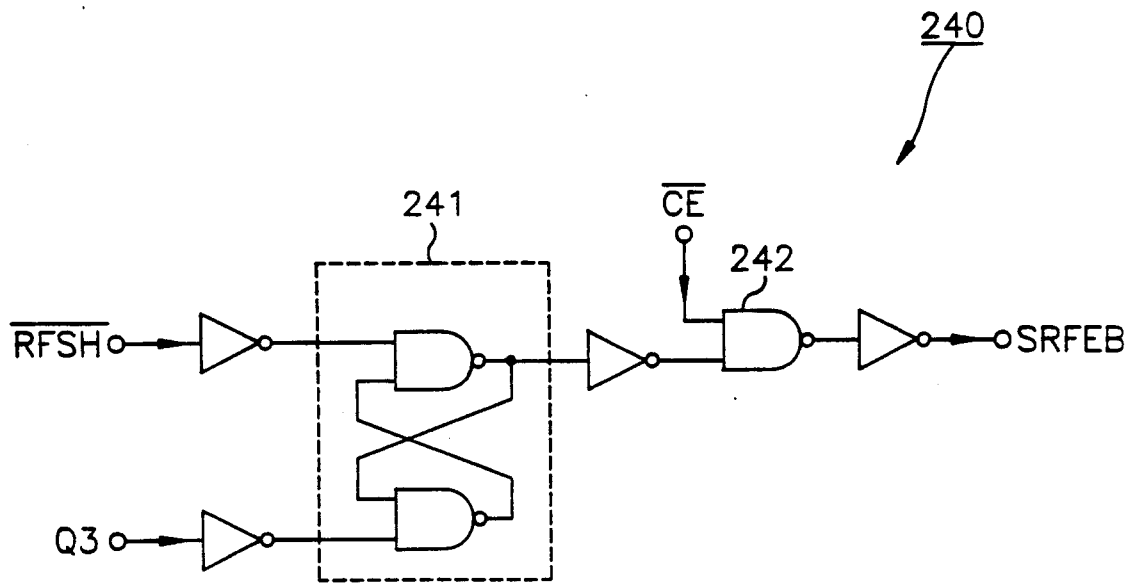
FIG. 5 is a preferred embodiment of a refresh enable circuit shown in FIG. 3.

With reference to FIG. 5, signals Q3 and $\overline{RFSH}$ are inverted and transmitted to latch 241. The output of latch 241 is inverted and fed to NAND gate 242 as is signal $\overline{CE}$. The inverted output of NAND gate 242 corresponds to signal SRFEB. Signal SRFEB is an input to selection circuit 450 of back-bias generator 300.

Figure 6:
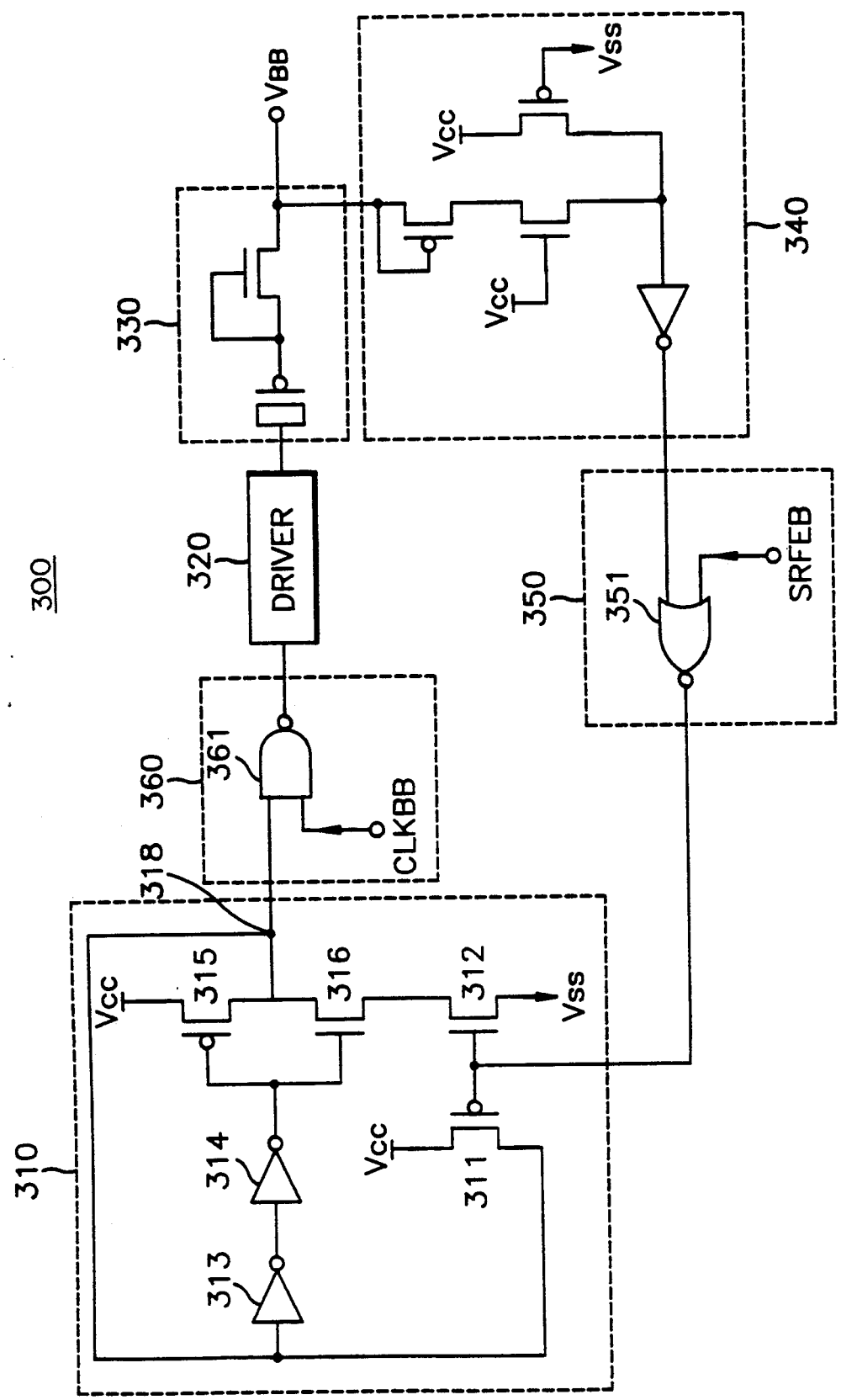
FIG. 6 is a circuit diagram of a back-bias generator according to the present invention.

With reference to FIG. 6, selection circuit 350 includes NOR gate 351 for receiving a back-bias level detection signal generated in back-bias level detection circuit 340 and signal SRFEB from refresh enable circuit 240. The output of NOR gate 351 is transmitted to oscillator 310.

Oscillator 310 is controlled by the complementary turn-on operation of PMOS transistor 315 and NMOS transistor 316. When NMOS transistor 312 is turned on, the logic state of the output signal at node 318 oscillates between a logic "low" state and a logic "high" state. When NMOS transistor 312 is turned off, oscillator 310 remains inactive and node 318 is set logic "high". Driver control circuit 360 receives the output from oscillator 310 which is in turn gated with pulse signal CLKBB at NAND gate 361.

Figure 7:
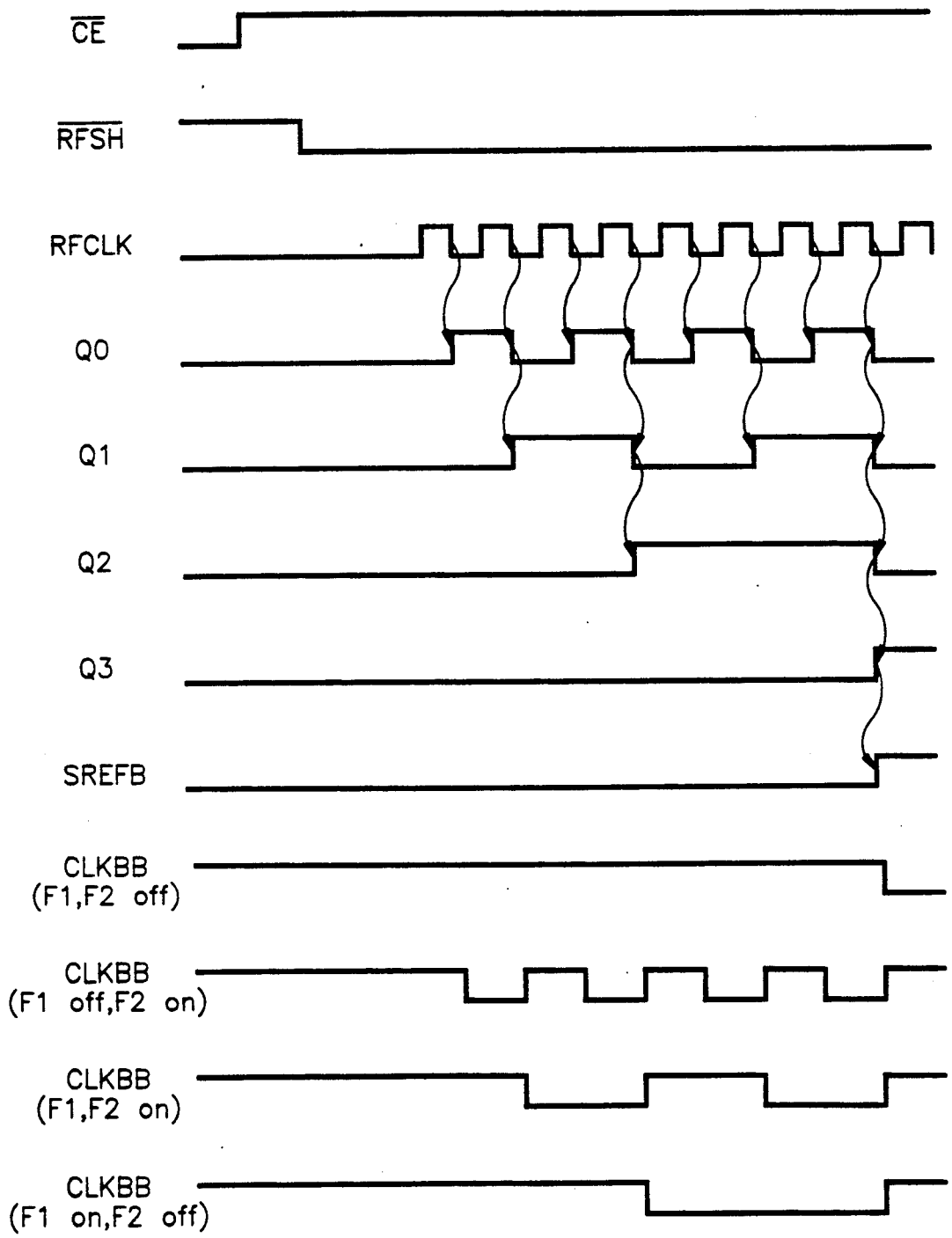
FIG. 7 is a timing chart according to the present invention.

Hereinafter, the operation of the present invention will be specifically described with reference to the timing diagram of FIG. 7.

When the signal $\overline{CE}$ is disabled in a logic "high" state, the signal $\overline{RFSH}$ is activated. Refresh timer 230 generates pulse RFCLK of predetermined period and binary counter 250, receiving pulse RFCLK, generates signals Q0, Q1, Q2, Q3 in response thereto, each of signals Q0-Q3 being of a different frequency. For example, if pulse RFCLK has a period of 1 μs, signals Q0, Q1, Q2, Q3 will have periods of 2 μs, 4 μs, 8 μs and 16 μs, respectively.

When signal Q3 is triggered up, latch 241 of refresh enable circuit 240 receives an inverted Q3 signal. During a refresh operation, signal $\overline{RFSH}$ is at logic "low" and signal $\overline{CE}$ is at logic "high", setting signal SRFEB to logic "high."

When the refresh operation is completed (inactivated), signal $\overline{RFSH}$ goes logic "high" and signal SRFEB becomes logic "low".

In this state, the output of NOR gate 351 of selection circuit 350 represents a present back-bias voltage as detected by back-bias voltage detection circuit 340.

When signal SRFEB is at logic "high" so that NOR gate 351 will output a logic "low" signal instead, PMOS transistor 311 is turned-on and oscillator 310 will thus not oscillate.

In the back-bias control clock generating circuit 400 shown in FIG. 4, the electric potential at second node 403 is preset to logic "low" state when first fuse F1 is cut off. Similarly, the electric potential at fourth node 404 is in logic "low" state when second fuse F2 is cut off. By presetting the connection/disconnection states of fuses F1 and F2, one of four different frequencies for pulse signal CLKBB can be selected.

When F1 and F2 are all cut off, an inverted Q3 signal is transmitted as CLKBB signal, the CLKBB signal and the Q3 signal thus having the same frequency. When F1 and F2 remain connected, an inverted Q1 signal is transmitted as the CLKBB signal. When only one of the F1 or F2 fuses is cut off, an inverted signal Q0 or an inverted signal Q2 is transmitted as the CLKBB signal, respectively.

As shown in FIG. 6, when the SRFEB signal is set logic "high," PMOS transistor 311 of oscillator 310 is turned on to provide a logic "high" electric potential at node 318. At that state, the output of NAND gate 361 of driver control circuit 360 is determined only by the pulse signal CLKBB, of which frequency is preset by the connection/disconnection of fuses F1 and F2.

Although fuses F1 and F2 are used to preset a selected frequency of pulse signal CLKBB in the embodiment of the present invention, any non-volatile programmable memory element can be substituted therefor.

The gating logic used to implement the function of selection circuit 350 and driver circuit 360 need not be limited to that presented in the preferred embodiment. These circuits may be easily constructed using similar gating logic schemes without departing from the spirit and scope of the present invention.

Because this invention relates to semiconductor memory devices which provide for memory cell and back-bias operation, this invention can be easily implemented in a general DRAM, a pseudo static RAM and/or a memory device which is to be used in a battery operated portable personal computer.

In conclusion, the present invention reduces power consumption by selectively setting an optimum frequency of a back-bias control clock signal fed to a back-bias generator, the optimum frequency being conditioned with respect to the timing of a self-refresh operation.

While this invention has been described in connection with what is presently considered to be the most practical and preferred embodiment, it is to be understood that the invention is not limited to the disclosed embodiment, but, on the contrary, is intended to cover various modification and equivalent arrangements included within the scope of the appended claim.

What is claimed is:

1. A programmable back-bias control clock generating circuit for use with a semiconductor memory device having a back-bias voltage generator, said programmable back-bias clock generating circuit comprising;
    input means for receiving a predetermined number of signals of different frequency; and
    means for generating a back-bias control clock pulse comprising a first programmable selector circuit, a second programmable selector circuit and third selector means, said third selector means for selecting one of said predetermined number of signals transmitted from said input mans in response to an output from each of said first and second programmable selector circuits, said back-bias control clock pulse for maintaining a steady back-bias oscillating frequency to said back-bias voltage generator during a memory self-refresh operation.

2. The semiconductor memory device of claim 1, wherein said first and second programmable selector circuits include a predetermined number of programmable fuse links.

3. A back-bias generator in a semiconductor memory device having memory self-refresh operation, comprising:
    means for receiving a self-refresh enable signal;
    means for receiving a back-bias control clock pulse from a back-bias clock generating circuit, said back-bias control clock pulse providing a steady back-bias oscillating frequency during a memory self-refresh operation;
    charge pump means coupled to an oscillator and a back-bias voltage detection circuit for generating a back-bias voltage;
    selection means for receiving an output from said back-bias voltage detection circuit and selectively transmitting an input signal to said oscillator in response to said self-refresh enable signal; and
    driver control means connected to said charge pump means for gating an output from said oscillator and the back-bias control clock pulse from said back-bias clock generating circuit.

4. The semiconductor memory device of claim 3, wherein said back-bias clock generating circuit comprises a first programmable selector circuit, a second programmable selector circuit and third selector means, said third selector means for selecting one of a predetermined number of signals transmitted from a counter in response to an output from each of said first and second programmable selector circuits.

5. The semiconductor memory device of claim 4, wherein said first and second selector circuits include a predetermined number of programmable fuse links.

6. A semiconductor memory device comprising:
 means for generating a refresh clock pulse;
 counter means for generating a predetermined number of signals of different frequency in response to said refresh clock pulse;
 means for generating a self-refresh enable signal in response to said predetermined number of signals from said counter means;
 means for generating a back-bias control clock pulse comprising first, second and third selector circuits, said third selector circuit selecting one of said predetermined number of signals transmitted from said counter means in response to an output from each of said first and second selector circuits;
 means for generating a back-bias voltage including an oscillator circuit and a back-bias voltage detection circuit;
 selection means for receiving an output from said back-bias voltage detection circuit and selectively transmitting a signal to said oscillator circuit in response to said self-refresh enable signal; and
 driver control means for receiving an output from said oscillator circuit and said back-bias control clock pulse.

7. The semiconductor memory device of claim 6, wherein said first and second selector circuits include a predetermined number of programmable fuse links.

* * * * *